United States Patent
Oksanen et al.

(10) Patent No.: US 12,165,922 B2
(45) Date of Patent: Dec. 10, 2024

(54) METHOD AND STRUCTURE FOR THIN-FILM FABRICATION

(71) Applicants: Jani Oksanen, Espoo (FI); Tuomas Haggrén, Espoo (FI)

(72) Inventors: Jani Oksanen, Espoo (FI); Tuomas Haggrén, Espoo (FI)

( * ) Notice: Subject to any disclaimer, the term of this patent is extended or adjusted under 35 U.S.C. 154(b) by 117 days.

(21) Appl. No.: 17/767,091

(22) PCT Filed: Oct. 8, 2020

(86) PCT No.: PCT/FI2020/050665
§ 371 (c)(1),
(2) Date: Apr. 7, 2022

(87) PCT Pub. No.: WO2021/069801
PCT Pub. Date: Apr. 15, 2021

(65) Prior Publication Data
US 2022/0367275 A1 Nov. 17, 2022

(30) Foreign Application Priority Data

Oct. 8, 2019 (FI) ........................... 20197122

(51) Int. Cl.
*H01L 21/78* (2006.01)
*H01L 21/027* (2006.01)
(Continued)

(52) U.S. Cl.
CPC ...... *H01L 21/7813* (2013.01); *H01L 21/0272* (2013.01); *H01L 21/0331* (2013.01); *H01L 31/1896* (2013.01)

(58) Field of Classification Search
CPC ............ H01L 21/7813; H01L 31/1896; H01L 51/0016; H01L 21/0272; H01L 21/0331
See application file for complete search history.

(56) References Cited

U.S. PATENT DOCUMENTS 8,378,385 B2  2/2013 Forrest
10,141,469 B1  11/2018 Cavallo
(Continued)

OTHER PUBLICATIONS

Prinz, V. YA. A new concept in fabricating building blocks for nanoelectronic and nanomechanic devices. In: Microelectronic Engineering Netherlands: Elsevier, Sep. 2003, vol. 69, No. 2-4, p. 466-475, ISSN 0167-9317 (print), <DOI:10.1016/S0167-9317(03)00336-8>.

(Continued)

*Primary Examiner* — David Vu
*Assistant Examiner* — Brandon C Fox

(57) ABSTRACT

The present invention relates to the epitaxial lift-off of thin-films allowing the reuse of the expensive semiconductor substrates. In particular, it describes a structure and a method for epitaxial lift-off of several thin films from a single substrate (100) using a plurality of dissimilar sacrificial layers (101), strained layers (102, 104), and/or device or component layers (103). The properties of the sacrificial layers (101) and the strained layers (102,104) can be used (i) to facilitate the lift off process, (ii) to control the point of time of release of each released thin film individually and (iii) to aid in separation and sorting of the released thin films. The released device or component layers can comprise various useful structures, such as optoelectronic devices photonic components.

15 Claims, 4 Drawing Sheets

(51) Int. Cl.
   *H01L 21/033*   (2006.01)
   *H01L 31/18*    (2006.01)

(56) References Cited

U.S. PATENT DOCUMENTS

| | | | |
|---|---|---|---|
| 10,186,629 | B2 | 1/2019 | Forrest |
| 11,367,647 | B2 * | 6/2022 | Jang .......................... C09J 7/38 |
| 2008/0108171 | A1 * | 5/2008 | Rogers ................. H01L 31/184 |
| | | | 438/455 |
| 2013/0005119 | A1 * | 1/2013 | Bedell ................. H01L 21/7813 |
| | | | 257/E21.09 |
| 2013/0043214 | A1 | 2/2013 | Forrest |
| 2013/0082303 | A1 * | 4/2013 | Cheng .................... H01L 29/20 |
| | | | 257/E29.089 |
| 2015/0170970 | A1 | 6/2015 | Forrest |
| 2016/0197227 | A1 * | 7/2016 | Forrest ................. H01L 21/187 |
| | | | 438/691 |
| 2016/0307924 | A1 | 10/2016 | Forrest |
| 2017/0069491 | A1 * | 3/2017 | Cheng ............... H01L 21/32051 |

OTHER PUBLICATIONS

Yastrubchak, O. et al. Anisotropic strain relaxation in lattice-mismatched Ill-V epitaxial layers. In: Physica Status Solidi C Germany: Wiley-VCH, Apr. 7, 2005, vol. 2, No. 6, 1943-1947, ISSN 1610-1634 (print, <DOI:10.1002/pssc.200460530>.

Xiuling Li: "Topical Review; Strain induced semiconductor nanotubes: from formation process to device applications", Journal of Physics D: Applied Physics, Institute of Physics Publishing Ltd, GB, vol. 41, No. 19, Oct. 7, 2008 (Oct. 7, 2008), p. 193001, XP020140826, ISSN: 0022-3727, DOI: 10.1088/0022-3727/41/19/193001.

* cited by examiner

METHOD AND STRUCTURE FOR THIN-FILM FABRICATION

INTRODUCTION

III-V materials are often though of as the workhorse of the optoelectronics industry due to their typically direct band gaps, high carrier mobilities and band gap values suitable for e.g. optical communications and high-performance solar cells. However, their inherent drawback is the relatively high cost of the substrates. To circumvent this, various approaches have been explored to create thin-film devices that are released from the growth substrate, allowing substrate re-use and incurring significant cost reductions. In terms of cost-effectiveness epitaxial lift-off (ELO) has been identified as the most promising approach [1]. In addition to the cost savings via substrate re-use, the thin-film devices have the advantages of flexibility and the possibility of integration to various everyday materials.

In epitaxial lift-off, a sacrificial layer is grown on a parent substrate, followed by various layers that typically constitute a device structure, such as a solar cell, a lasers or a LED, or components thereof. As the name suggests, all of the layers are grown epitaxially, resulting in high crystal quality that is crucial for high-performance applications e.g. in optoelectronics. In order to release the thin-film device, the sacrificial layer is selectively removed by etching. Subsequently, the substrate can be re-used and the released film taken to further processing and/or for integration to host materials such as plastics, glass or Si. Fabrication of thin-film structures via ELO therefore has significant potential in manufacturing flexible devices such as solar cells to be implemented on cars, drones, satellites and other applications.

Research on ELO was initiated already in 1970s using liquid-phase epitaxy and film thickness in the range of tens of micrometers [2]. An important aspect of any large scale ELO process is the bending of the released films during the sacrificial layer removal. Without bending, etchant diffusion and etching rate are limited, thus limiting released film size [3], or making the release impractically slow [4, 5]. In the pioneering work by Konagai [2] and for the following decades the bending has been mainly attained either by depositing a strained polymer layer on top of the films to be released (e.g. 'black wax' [6, 2]) or by an external pull of the released films (e.g. using the weight-induced method [7, 8]). In these methods, the handle layer, such as black wax or a suitable polymer adhesive, is deposited or attached on top of the ELO wafer. The strain introduced by the polymer on the top layers, or the external force applied on the handle is then used to pull the released film outwards from the substrate. Previous art includes also the use of an external apparatus to aid in the bending of the released film [9, 10]. In each case, a gap forms between the released film and the substrate, allowing the etchants to reach the etch front and eventually release devices even in wafer scale.

The established methods above introduce challenges in scaling up and in automating the lift-off process flow. Accordingly, several alternative approaches have been developed, such as bending induced by a metallic stressor layer [11, 12] and surface-tension assisted ELO which was developed already in 1990s [13] and is still attracting attention [14, 115]. In surface tension-assisted ELO, the wafer is slowly submerged in the etchant, where the sacrificial layer is removed and the surface tension causes the released part of the released film to float. In yet other related approaches known as controlled spalling, a strained layer is used to introduce a large compressive strain on to the material surface, to use a unique fracture mode allowing to release a thin material layer through a spontaneous crack forming a few micrometers below the strain interface [16]. In addition to these, recently also combinations where epitaxially strained layers adhered to relatively thick metallic support layers have been demonstrated [17].

In Konagai's early work also a multilayer-ELO (named multi-peeled film technology, MPFT) was proposed. Despite the early conceptual framework, development of multi-layer ELO (M-ELO) has been continued only quite recently [18, 19], but still without the ability to bend the layers to promote etching, which limits the size of the released films. As a result, the state-of-the art M-ELO process is restricted to mm-scale devices and has thus limited applications in industry. Previously disclosed approaches to multi-layer ELO also include complicated procedures where multiple sacrificial layers and device structures are deposited on the substrate in separate growth chambers [20], M-ELO for transfer-printing, where small device films are tethered on the substrate until transfer-printed [21], and processes using externally-applied strain [15, 12, 9, 10]. These are all either single-layer release processes where strain is applied on a single device or approaches that do not rely on strain at all. For entirely different purposes of radial stacking of solar cells, on the other hand, it is known that with modern thin films, it is possible to release very small single device layers with the radius of curvature in micrometer-scale without film cracking [22].

The present invention discloses a controlled and scalable multi-layer ELO structure and method using multiple stacked sacrificial layers and appropriately engineered strained layers incorporated to the released films, named here as strained millefeuille ELO (SM-ELO). The disclosed method and structure thus allow the controlled and optimized release of multiple thin film structures from a single parent substrate. In addition, the invention provides the means of separating and sorting of the released thin films, by controlling the timing of release and the curvature of the films, as well as a method for collecting films for subsequent processing after ELO. Overall, the present invention solves the past challenges in M-ELO related with the cracking of the released films and/or the size limitations of the films, and provides a controlled way to do the multi-layer lift-off of several films on the scale of full wafers. This makes it possible to produce a large number of epitaxially lifted off films in a single process, which substantially facilitates the lift-off process and brings down the cost of the thin-films to level where industrial applications become possible in large scale.

GENERAL DESCRIPTION

Conventional epitaxial lift-off has been developed to save and recycle expensive substrate materials (such as gallium arsenide). In the present invention a substrate, such as a GaAs wafer, is placed in a material deposition tool, including epitaxial tools, such as metal organic chemical vapor deposition (MOCVD), or any other system where epitaxial films or other material films are fabricated, grown or deposited. The deposition or epitaxial tool or system is used to form a layer structure, where tension within the structure can later be used to bend specific layers. One of the key advantages of the disclosed layer structure is the ability to release multiple thin films controllably from a single layer stack. Some preferred embodiments of the method and structure enabling this are briefly described below in the following non-limiting example.

In one embodiment, the SM-ELO structure comprises a number of base layer groups each further comprising a number of sacrificial layers, strained layers and layers constituting structures used e.g. in devices or components (hereafter named device or component layer, DCL). The sacrificial layer can be removed selectively during ELO, while the other layers can be included in the released film. The strained layers bend the released film in order to promote the removal of the sacrificial layer. In order to fabricate several devices or components from a single substrate, several of these base layer groups (sacrificial layers, strained layers and device or component layers) can be stacked upon each other in a single growth or deposition step. Subsequently, the sacrificial layers from each base layer group can be removed selectively, while their removal rate and thus the point of time of release for each released film is determined by the properties chosen for each base layer group individually. The in-built tension enables large-scale ELO by promoting the sacrificial layer removal, and is additionally useful in the separation of released films, and the sacrificial layer materials and compositions can be used to control their removal. As a whole, the process enables large-scale ELO for multiple films from a single substrate, and each of the released films can individually constitute a device, component or parts thereof.

In some preferred embodiments of the invention the layer structure may include any number of sacrificial layers, strained layers, and device or component layers or their combinations, with one possible configuration shown in FIG. 1. Each layer may consist of one or more sublayers that may contain different materials of different thicknesses, and that may be p-type, n-type, undoped or intrinsic. The layers and sublayers can be composed for example of GaAs, AlGaAs, InP, GaP, GaSb, AlSb, InSb, AlAsSb, GaAsSb, InGaP, AlInP, or any combination or graded composition of these or other suitable materials. Each of the layers may be used to create one or more of various device types, such as solar cells, photodetectors, lasers or LEDs or parts thereof upon which more parts can be added/deposited subsequently to form devices and/or components. Similarly, parts can be removed from or added to the films prior to, during or after their release e.g. in order to modify their functionality. The layer stack can be used for epitaxial lift-off, where any number of sacrificial layers can be removed in order to release any number of any of the other layers. The materials, compositions, doping, device type, thicknesses and any other properties of each layer or a part thereof can be different or the same, or some can be different and some can be the same.

In contrast to prior art, the present invention provides approaches to control the film bending and the removal of individual sacrificial layers. Both of these can be used to control the release rate and thus point of time of complete release for each film individually. In addition, both bending and point of time of release can be used for the separation and sorting of the released films. In addition, in the present invention strained layers can be placed on top, on the bottom, or both the top and the bottom of the released films or DCLs. In addition, the strained layers can be extremely thin and can also be removed either during the ELO process or after it in order to straighten the films, which can be beneficial in their handling and processing. These aspects are crucial to the ability to realize the strained millefeuille lift-off method. This leads to several key differences between the earlier state of the art and the foregoing description. These comprise e.g. the following differences:

First, regarding the strained layers; in the present invention they are individually tailored and can be dissimilar and located below, above or within the released films or DCLs and they can have either smaller or larger lattice constant compared to the other parts of the released film or the DCL. Therefore, they can be positioned on top, bottom, or both top and bottom of the released film, or within the released film, and in each case the strain exerted by them can bend the released film to the same direction (typically outwards from the substrate at the edges), which can facilitate film release, separation and sorting. Additionally, sufficient strain for film bending and etching promotion can be attained using large-lattice-mismatch materials, allowing the use of very thin strained layers with thicknesses down to few nanometers, or even one nanometer or less in some embodiments. The strained layers in the present invention can be composed of materials that can be selectively removed after or during the ELO which can be beneficial in the handling and processing of the released film. It should be noted that the state-of-the-art multi-layer ELO process by Yoon et. al or Rogers et. al employs no strained layers and therefore differs from the presented invention greatly [18, 21]. In Konagai's early work [2], the strained layers were made solely of several micrometer thick AlGaAs layers on both top and bottom of the released films, limiting the applicability of the method due to the large and uncontrolled strain leading to defect and crack formation.

Second, regarding the sacrificial layers; they can be lattice-matched to the growth substrate, which avoids unnecessary strain accumulation and therefore enables growth or deposition of larger number of releasable films without strain-related defect formation. Additionally, the sacrificial layer material and composition can be tuned to be more or less resistant to certain solutions or etchants or other removal methods, which allows the control of their removal rate and therefore the point of time of their release. In addition, groups of thin films can be released in one solution type or with one removal method, for which other group or groups of sacrificial layers are resistant. For example, one group of films can be released by etching Al(Ga)As-based sacrificial layers, and another group can be released by etching AlGaInP-based sacrificial layers. In addition, in the present invention the sacrificial layer compositions, materials and thicknesses can be used to control the point of time of film release, which is useful e.g. in separation of the released films. In the prior art (e.g. by Konagai [2] or Yoon [18]), the sacrificial layer composition was not used to control the etch rate, or to release groups of layers selectively e.g. by using different etchants.

Third, in the present invention film curvature is employed to control the etch rate, which provides an additional tool for controlling the point of time of the film release. The curvature itself can also be used to prevent the released films from adhering to each other, and to separate and sort the released films. Curvature or strain has been used to control etch rate in single films in previous research [17], but not to control the release time of several films or to facilitate their separation, which are crucial aspects in SM-ELO.

Fourth, in our invention the strained layers can be removed during or after the ELO process, thus removing strain and straightening the films, which can be used to ease their subsequent handling and processing. On the other hand, the curvature can be used to aid film separation and sorting after or during their release in ELO, possibly prior to removing the strained layers and straightening the films.

Fifth, in our invention the strain and/or layer composition can be tuned across the wafer by e.g. temperature gradient in some systems such as MOCVD, or by other means in other systems. Composition and/or strain gradient can be used e.g. in preferring some etching directions over others, which may be used to avoid possible stress accumulation during release due to film bending. In some embodiments of the invention, directional and/or partial removal of the sacrificial layers can be achieved also by exposing only selected areas or etch fronts to the etchant or other means of removal, for example by patterning grooves or other channels e.g. prior to the lift-off, enabling exposure to selected crystal planes as well as choosing of the shape of the released films.

Sixth, in some embodiments transferring the released thin films is done using customized carriers, such as those with microporous surfaces, and/or control of surface tension and/or adhesion strength between carriers and the released films.

BRIEF DESCRIPTION OF THE DRAWINGS

The foregoing description can be better understood with the aid of drawings, which are shortly presented here. The appended drawings are meant to illustrate some embodiments of the invention, and should not be considered to limit its scope, which is defined by the claims only. Consequently, for example, the number of any of the layers may differ from those illustrated in the drawings and all of the disclosed aspects or embodiments of the invention can be used in any combination with each other or prior art. The proportions and dimensions in the Figures, as well as limiting the Figures to represent strictly 2D structures for simplicity, do not necessarily correspond to real devices, and the dimensions and proportions, including those relative between different parts, may differ by any factor from those presented in the Figures.

In FIG. 3 one or more parameter differs in the sacrificial layers, resulting in different etch/removal rate and thus rate of film release.

DETAILED DESCRIPTION

Figure 1:
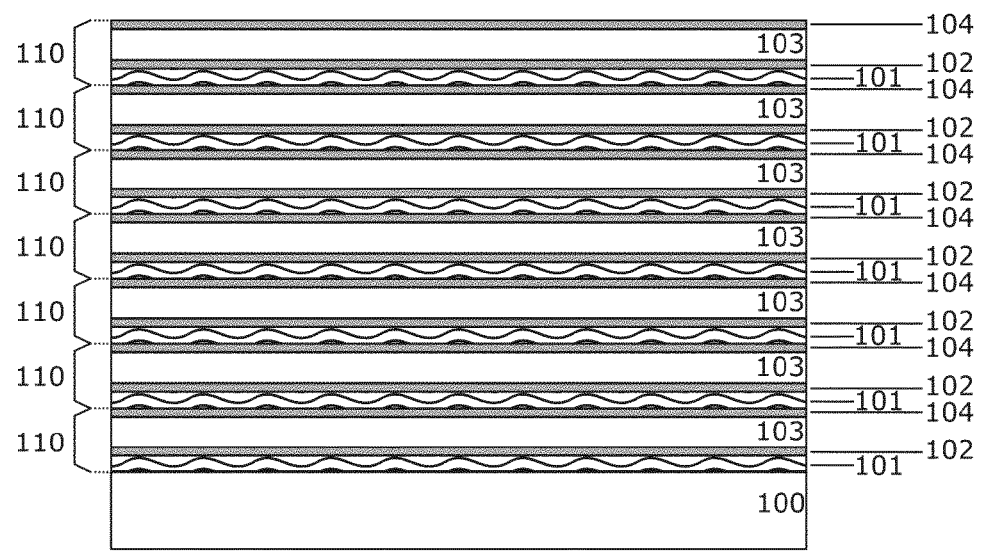
FIG. 1 depicts an embodiment where the epitaxial stack comprises several groups of sacrificial layers, strained layers and device or component layers deposited on a parent substrate.

In the following detailed description of the invention and the drawings, III-V materials or III-V semiconductors refer to materials that consist of at least one element from the group III (or 13) of the periodic table (such as aluminum (Al), gallium (Ga) or indium (In)) and at least one element of the group V (or 15) of the periodic table (such as nitrogen (N), phosphorus (P), arsenic (As) or antimony (Sb). Thin films or thin semiconductor films refer to films of III-V semiconductors or other semiconductors or materials that are generally 0.1 nm-1000 µm, or preferably 10 nm-10 µm thick. Typically (but not necessarily), device or component layers are 1 nm-100 µm, or preferably 10 nm-10 µm, thick, while each strained layer may be even 1 monolayer, or up to several hundreds of nanometers thick. Regarding the descriptions of the positions of the layers, directly below a layer refers to a position next to the said layer on the side of the parent substrate, and directly above a layer refers to a position next to the said layer on the side opposite of the parent substrate. Layer structures that are presented with '/' symbol between different materials or thicknesses denote a structure where the layers are deposited subsequently one after another. For example, in structure film1/film2/film3, film1 is deposited first, followed directly by the deposition of film2 and subsequently followed directly by the deposition of film3, or alternatively the order can be also the opposite.

In general, the preferred embodiments of the invention comprise a plurality of a) material layers that can act as sacrificial layers b) material layers with built-in strain that facilitate the separation of the released films during and/or after their release and c) device or component layers that are separated from the structure upon the removal of one or more of the said sacrificial layers wherein the properties of at least one of the sacrificial or strained layers are different from the properties of the other functionally similar layers. The thickness of the thin films is generally 0.01 micrometers-100 micrometers, or preferably 0.1 micrometers-10 micrometers. In some embodiments, the layers comprise epitaxial semiconductor made of III-V and/or II-VI semiconductors and/or are grown on a semiconductor substrate. The layer stack can be designed to limit the epitaxial strain and/or the number of strained layers so that it does not result in damaging of the layers.

An example of one preferred embodiment of the invention is depicted in FIG. 1. A parent substrate 100, such as III-V semiconductor wafer, is placed in a material deposition or growth system, for example MOCVD reactor for epitaxial growth. Material layers, for example epitaxial layers, are then deposited on the parent substrate. Prior to the layer structure depicted in FIG. 1, buffer layers and protective layers can be deposited in the same or another deposition system on the parent substrate. These buffer layers and protective layers can be used to smoothen or prime the substrate surface, and can be removed prior to substrate reuse after the epitaxial lift-off process. A layer structure depicted in FIG. 1 comprises sacrificial layers 101, device or component layers (DCLs) 103, strained layers directly below the DCLs 102, and strained layers directly above the DCLs 104. A base layer group 110 refers to a group that consists of a sacrificial layer 101, device or component layer 102, and at least one strained layer 102 or 104. For each base layer group 110, each of the layers 101, 102, 103 and 104, and their sublayers may be the same or different from other layer groups 110, or some layers may be the same and some may be different. In some embodiments, damaging of the layers is mitigated by limiting the epitaxial strain and/or the number of strained layers.

In one preferred embodiment of the invention one or more sacrificial layers 101 are etched or removed in an ELO process. The sacrificial layer parameters that can be used to allow selective etching and/or the release of the thin films at different rates include material compositions, thicknesses, doping, and multilayer/superlattice structure. The sacrificial layers can also have selectivity between different groups of layers, i.e. some sacrificial layers within a layer stack can be vulnerable to some chemicals or other removal methods while resistant to others, for which other sacrificial layers in the stack have the opposite behavior, for example they can be vulnerable to chemicals for which the other sacrificial layers are resistant, and resistant to chemicals for which other sacrificial layers are vulnerable. Typical materials for sacrificial layers are AlInP, InGaP, AlInGaP, AlAs, AlGaAs or any other suitable sacrificial materials or combinations thereof, that are typically lattice-matched or nearly lattice-matched to the parent substrate.

The device or component layer (DCL) 103 can consist of one or more layers, for example one or more of any GaAs, AlGaAs and InGaP layers with or without doping. Each of these DCLs may comprise layers that can be used as devices or components, or as parts thereof. In some embodiments of the invention, the strained layers 102 and/or 104 can also be located within the DCLs 103. In some embodiments of the invention, the DCLs comprise layers needed in the fabrication of thin-film solar cells, LEDs, lasers and/or any other devices that can be separated during the removal process (and transferred to carriers). In addition, the DCLs may comprise layers needed in the fabrication of other components for optics, photonics, electronics and/or optoelectronics such as polarizers, waveguides, spectrometers, photonic crystals, metamaterials and microring resonators, that can be fabricated and/or patterned prior to or after the lift-off or even during the lift-off. For example, in some embodiments a DCL 103 can comprise a single undoped GaAs layer, and another DCL can comprise several layers of different materials with various p- and/or n-type doping levels. For example, layers such as p-AlGaAs/p-GaAs/i-GaAs/n-GaAs/n-AlGaAs can be used as a device. The released films can be modified further in following processing steps, which may add or reduce parts, functionality or properties. In addition, processing steps may be applied to the layer stack before SM-ELO in order to modify its properties.

The strained layers such as 102 and 104 are used to create tension to the DCL. The tension bends the released part of the DCL 103. Among other parameters, the strained layer thicknesses, materials and compositions can be tuned to create tension that bends the layers. The strained layers and the bending can be used for exposing the unetched part of the sacrificial layer for selective removal and/or for the release of the DCLs at different rates. In some embodiments, the strained layers 102 and 104 are bent and released with the DCL 103. It should be noted that each DCL can individually include one of the strained layers 102 or 104, or both 102 and 104, as well as other strained layers within the DCL, with either compressive or tensile strain or a combination thereof. Additionally, the thickness, composition, material and other properties of each of the strained layers 102 or 104 may be the same, or different, or some properties can be the same and some can be different. In addition, while the illustrations present only one of each strained layers 102 or 104 for the sake of clarity, in many embodiments, any of the DCLs can incorporate one or two or more strained layers at any location within the DCL with each strained layer having their individual tension. As such, the number of layers under strain in each DCL is not limited and can be one, two, three or more. In many embodiments, each DCL can incorporate several layers with varying strain that can be compressive or tensile, or even shear, or any combination of these.

In some embodiments, the strained layers are used as parts of a structure that is used to create a device or a component, such as an optoelectronic device. For example, if the device incorporates a double-heterojunction structure such as AlGaAs/GaAs/AlGaAs or InGaP/GaAs/InGaP, the AlGaAs or InGaP layers can be used to create strain that bends the layers. Other examples include structures such as solar cells and LEDs that consists of many layers of various different materials. In some embodiments, there can be material layers between the strained layers and sacrificial layers. As such, the strained layers can be isolated partially or completely from the etching solution or from other means that are used to remove the sacrificial layers.

In another embodiment, the strained layers are not used as parts of devices, but only to create tension to the DCL. For example, few-monolayer or few-nanometer thick InGaAs or InAs strained layers can be used to create strain to a GaAs-based DCL, even when they are not integral parts of any device or component. For example in such cases the strained layers can be designed to be removed during or after the sacrificial layer removal step, so that in some embodiments, the strained layers themselves are selectively removed during and/or after the lift-off. This can be e.g. used to remove the bending of the DCLs after or during the ELO process and to remove the strain from the released structure to reduce total stress of the released layers once strain in a particular position is no longer needed for keeping the etching channel open.

In some embodiments, one or more of the sacrificial layers and/or strained layers comprise more than one sublayers with more than one different materials or compositions or dopants, which can be used to control reactivity to etchants/chemicals/other removal methods and/or bending of the thin films being released, and/or to suppress defect propagation in the structure. For example, one sacrificial layer 101 may consist of several sublayers. In some embodiments of such sacrificial layer, it consists of any number of alternating AlInP and InGaP layers with same or individual thicknesses, for example AlInP/InGaP/AlInP/InGaP/AlInP with thicknesses of 1, 2, 5, 20 nm or any other thickness for each layer individually. Due to the different etch rates of different materials, for example InGaP, AlInP and AlGaInP in hydrochloric acid, the etch rate of the sacrificial layer and thus the release rate of the DCLs can be controlled in a similar way as with directly modifying the material composition of a single material.

Figure 2:
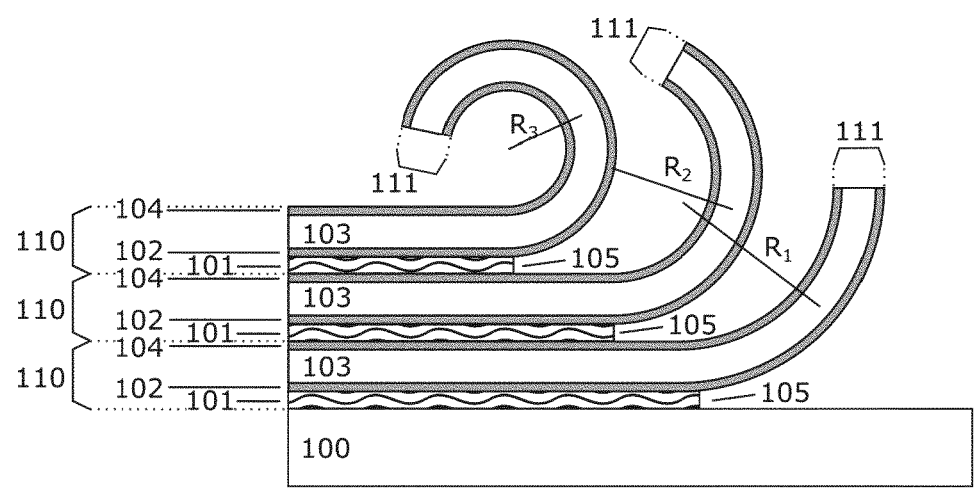
FIG. 2 depicts an embodiment where the epitaxial stack comprises three groups of sacrificial layers, strained layers and device or component layers. In this embodiment, tension on each device or component layer differs in order to control the bending of the released layers and the etch rate of their respective sacrificial layers.

In some embodiments of the SM-ELO, one or more base layer groups 110 are deposited on a parent substrate. The strained layers are used to create curvature to each of the DCLs in order to control the etch rate for each DCL individually. FIG. 2 shows an example of such structure with three base layer groups 110. For clarity, released films 111 are shown in some of the Figures, and they can comprise any combination of the DCL 103 and any number of strained layers such as 102 or 104. A DCL 103 itself may include any number of strained layers, or the strained layers may be removed during the lift-off, and therefore, a released DCL can correspond to a released film 111 as well. Typically, the radius of curvature is designed to be smallest in the topmost DCL, and is increased in the layers towards the substrate. Smaller radius of curvature leads to more open etching channel to the etch front 105, which enhances etchant diffusion to the etch front. The different curvatures allow differences in the etch rates, which enables lift-off of several DCLs at different points of time, or nearly simultaneously. The tension may be created in each DCL by one or both of the strained layers 102 and 104, or by any other strained layer(s) within the DCLs, in place of, or in addition to 102 and 104. In one preferred embodiment with multiple different DCLs with different thicknesses, the released films can be sorted by their thickness so that the thin DCL allowing the largest curvature can be placed on the top of the stack while the thick DCL are placed closest to the substrate. In other similar embodiments, other parameters besides thickness, such as tension, can be used to control the radius of curvature.

Figure 3:
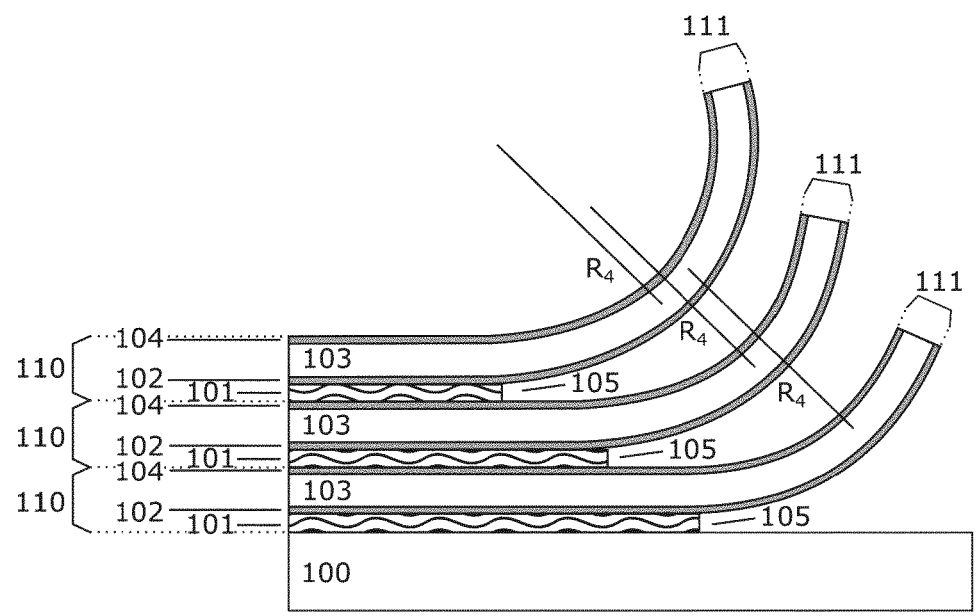
FIG. 3 depicts an embodiment where the epitaxial stack comprises three groups of sacrificial layers, strained layers and device or component layers. The sacrificial layers may have different parameters such as composition, materials, thickness, inclusion of sublayers etc.

In another embodiment, the sacrificial layers 101 have different properties that result in different etch or removal rates. The DCLs may then have the same curvature, or it can be controlled individually. FIG. 3 shows an example of such structure with three base layer groups 110, and with same radius of curvature for each DCL. Additionally, the sacrificial layers can be removed with same or different removal chemicals or methods. For example, one or more of the sacrificial layers can be composed of AlAs or AlGaAs alloys that are etched with hydrofluoric acid in one or more removal steps, whereas other sacrificial layer or layers can be InGaAlP alloys with various compositions, that are etched in other step or steps in hydrochloric acid. Each sacrificial layer may also comprise any number of sublayers, that may have different composition, may be composed of different materials and may have other different properties such as doping. These sacrificial layer stacks may be used to control the etch rate, and to make them more or less resistant to different etchants.

In some embodiments, one or more of the strained layers and also one or more of the sacrificial layers are used to control the etch rates, thin film release rates, and/or points of time for release. The point of time of film release can be used to facilitate their separation and/or their transfer to other substrates and/or their further processing. In addition, the separation of each of the released thin films can be assisted individually by strained layers (or radii of curvature of the released films) and/or the sacrificial layer removal rates.

Figure 4:
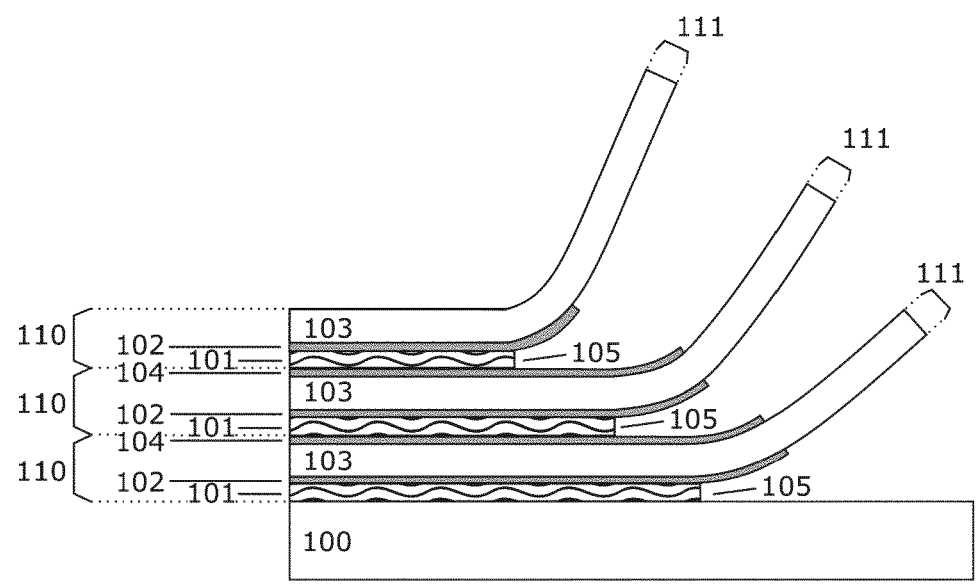
FIG. 4 depicts an embodiment where the epitaxial stack comprises three groups of sacrificial layers, strained layers and device or component layers. In this embodiment, the sacrificial layers and/or strained layers differ in a way that the device or component layers are released at different rates. Additionally, selected strained layers are removed so that the released part of the device or component layers becomes straight or flat or nearly straight or flat.

FIG. 4 shows yet another embodiment of the SM-ELO, where the strained layers are removed during the release process in order to straighten the released layers during the lift-off e.g. by using a strained layer that can be etched with the same method that is used to etch the sacrificial layer, but with a slower rate. In other similar embodiments, the strained layers are removed after the ELO process. Such strained layers can be for example 0.1 nm-10 µm, or preferably 1 nm-100 nm, thick, and they can be composed for example of InGaAs or other III-V semiconductors. The strained layers can be removed also after the film bending is employed in the separation and sorting of the released films.

In yet another embodiment of the invention one or more of the sacrificial layers can be designed to be prone to electrochemical or photoelectrochemical etching, so that the etching speed can be controlled by the layer conductivity or optical absorption and the etching can be done in an electrochemical configuration. In some of such embodiments the sacrificial layer can be made of any suitable electrically conducting semiconductor such as p-GaAs, that can be etched electrochemically or photoelectrochemically.

In some other embodiments, one or more of the design parameters is anisotropic. Such design parameters include the strain in one or more of the strained layers either inherently or with external stimuli (such as applied voltage), the composition in one or more of the strained layers, and the composition in one or more of the sacrificial layers. The anisotropic strain and/or anisotropic etching is used to attain directionality to the bending and/or sacrificial layer removal. As an example of such an approach, a composition gradient is included in any number of the layers. For example, in a layer composed of AlGaInP, some areas on the growth substrate may be more Al-rich compared to others, while some others can be more Ga-rich, which may result in variable reactivity with an etchant, such as hydrochloric acid. The composition gradient can involve any combinations of the group III and group V elements. For example a layer at one side of the wafer can be AlAs (or Al-rich AlGaAs), where Ga content is increased gradually so that the material composition in the same layer at another position, e.g. the opposite side of the wafer, is GaAs (or Ga-rich AlGaAs). The gradient can be attained by various means, for example in a MOCVD system a temperature gradient can be used for example using temperature difference of 1 K-100 K or more at different positions of the wafer, or an uneven supply of growth materials, and in other systems the gradient can be attained by other means. In sacrificial layers, the composition gradient can affect the etch rate in different parts of the substrate, thus enabling the sacrificial layer etching or removal to proceed faster from some direction or directions than others. In strained layers, the composition gradient can be used to create more strain to some parts compared to some other parts, which may be used for facilitation of sacrificial layer removal and film release. The composition gradient in the strained layers may be used to create even opposing strain in different parts of the substrate, which may be used to suppress the film release in some parts and promote the release in other parts. In general, the film removal being more directional may be used to avoid strain accumulation during the release, which could be otherwise harmful and cause cracks to the released films. Especially in embodiments using electrochemical means for the etching of the sacrificial layers, the external potential and current will preferably be directed along the sacrificial layer so that the applied voltage (preferably 0.1-10V, not accounting for resistance in the electrolyte) is applied across the wafer.

In other embodiments, anisotropic or directional etching is attained by directional exposure to etchants, for example by using a small amount of etchant (e.g. a droplet) at a limited area, or by gradual introduction of the sample to the etchant (e.g. by gradual submerging at an angle or gradual filling of a container with an etchant). In some other embodiments, some areas or parts of the surfaces can be protected from the etchant or other removal methods, in order to initiate the removal from desired direction or directions. In yet other embodiments, directionality in the etching or removal of the sacrificial layers can be attained by anisotropy of the selective etching process, e.g. using different temperatures at different locations or electrical etching currents preferentially focused in a selected area of the structure. Directional or anisotropic etching may also be attained by creating patterns or shapes to the structure, which promote directional etching or removal, for example by selected crystal planes being exposed in the patterns or shapes.

Another example of an embodiment that may have anisotropic strain and/or etching is a structure that contains piezoelectric materials. The piezoelectricity can be used to create tension in addition to that created by the strained layers, or the strained layers themselves can be piezoelectric. In this case, they can be also exactly or nearly lattice-matched to the growth substrate and/or to the DCL, and the strain is created only via piezoelectricity. For piezoelectric materials, for example wurtzite III-V semiconductors can be used.

In some embodiments, passivation of any of the surfaces can be applied. For example, the DCL can have surface passivation at the top and/or at the bottom, e.g. to suppress surface recombination. The strained layers themselves can also provide the surface passivation. The passivation layers can be included during the deposition or growth of the whole layer stack, for example by using barrier or window layers, and can be composed of semiconductors with thicknesses ranging from below one nanometer up to tens or hundreds of nanometers or more. Alternatively, the passivation may be applied also after the growth or deposition of the layer stack, for example after the ELO process, for example using sulfur-based methods or thin-film deposition tools such as atomic layer deposition. Such approaches for passivation may include removal of a thin layer of the material, which may remove for example oxide based defects.

In some embodiments of the invention, the growth is initiated with or performed on a metamorphic buffer layer on a substrate. The metamorphic buffer layer can be resistive to any of the sacrificial layer removal methods, enabling the re-use of the substrate with the buffer, or it can be removed fully or partially during or after any sacrificial layer removal step. The metamorphic buffer layers can be used to reduce defect formation in DCLs or other thin films that have lattice parameters different from the parent substrate or to shield the buffer against any undesired etching residues during the layer removal. For example, metamorphic InGaP buffer layer could be used to initiate growth of InGaAs-based DCLs with for example optimal band gaps for tandem junction solar cells.

In general, any number of DCLs may be released in a single SM-ELO release step, which may be followed by subsequent release steps, where one or more additional DCLs may be released. For example, one release step or one etch step may remove one sacrificial layer type and release one group of DCLs, and another release step or etch step on same layer stack may remove another sacrificial layer type and release another group of DCLs. For example, some films can be released by etching AlGaInP-based sacrificial layers, while other AlGaAs-based sacrificial layers are not etched significantly, resulting only in the release of films with AlGaInP-based sacrificial layers. For each release step, each of the removed sacrificial layers may be more or less prone to the removal agent, which may result in different removal rate, which may be used to control the point of time of the film release. For example, Al content in AlGaAs-based sacrificial layers can be increased to increase the etch rate in hydrofluoric acid. After releasing the DCLs, the growth substrate can be re-used for the fabrication of another layer stack for SM-ELO or any other process, and further processing may be applied to the DCLs. For example, the DCLs may be placed on host substrates, or they can be adhered to a support layer, or a support layer can be adhered to them, and other processing steps can be employed such as photolithography, metal evaporation, patterning, etching and/or many others.

In some embodiments the released thin-film is transferred onto a new substrate or carrier directly from the liquid where it was released or subsequently cleaned, so that the new substrate allows fluids to escape from between the thin film and the said substrate, allowing the film to be picked up without damaging it. The substrate materials include but are not limited to glass, plastics, polymers, metals, insulators and semiconductors (e.g. silicon). The features include but are not limited to micro- and nanoporous materials, such as polymer or metal meshes, or substrates with micro- or nanosphere coating, or substrates with inverse opal structures that can be created e.g. using polystyrene spheres and atomic layer deposition. In addition, in some embodiments the substrate features are pores or channels through the substrate, through which the fluid can escape. In some embodiments the substrates can also be held stationary within the liquid while the films are guided on their surface and/or the liquids are drained and the films float onto the substrates.

The features in the substrates can be for example patterned by means of lithography and etching, for example in the shape of pedestals or grooves. In other embodiments, the features can result from the substrate fabrication process. For example, metal films can exhibit grooves that result from their fabrication methods, and these grooves can be utilized in the transfer of the films. Some embodiments incorporate more than one of the feature types. The escape paths for fluids from between the thin films and substrates can be used in mitigation of fluid and/or particles remaining between the film and the substrate. Otherwise, such remnants may damage the transferred films e.g. when heated during contact annealing or other processing.

In some embodiments the adhesion between the thin films and the transfer substrates can be controlled with the surface materials and/or properties (which can be further controlled by different treatments and functionalization), the surface area, and the fluid that is used to adhere the thin film and the substrate (for example, by liquid bonding or van der Waals bonding), as well as by environmental changes e.g. by exposure to heat. In the transfer method, the adhesion can be used in subsequent processing and/or film transfer steps. In some embodiments of the transfer method, weak adhesion is used to transfer the films further to other substrates, or to obtain self-standing films. In other embodiments of the transfer method, strong adhesion is used to adhere the thin films on the featured substrates. In yet other embodiments, the featured substrates can be used to obtain electrical contact to the thin films, which can be ohmic for example after heat treatment. Some embodiments also employ substrates and/or features that can be transparent to light and/or other electromagnetic radiation, while some other embodiments can employ substrates and/or features that are opaque or highly reflective to radiation. In yet other embodiments, the substrates and/or features are both transparent or nearly transparent to light and electrically conductive. Examples of such features include metallic stripes, grids or nanowires. In some such embodiments, the stripes, grids or wires comprise several material layers that can be used to create ohmic contact to both the substrate and the thin film. Such embodiments of the features can be utilized in the fabrication of devices where both the thin film and the substrate have a function in the device, such as multijunction solar cells, for example made of silicon substrate and III-V thin film.

In some embodiments of the invention, and in particular when the etching of the sacrificial layer is strongly non-isotropic, the films will be preferentially released as cylindrical rolls as drawn in FIGS. 1-4, with the etch front advancing as a line or several lines until a film is fully released. In some other embodiments, the films will be preferentially released as membranes conforming to more complex bending modes with the local bending radii and release rates still controlled by the disclosed mechanisms. For instance, in case of whole substrates with a (near) circular cross-section, the bending can be designed to preferentially conform to modes that are axisymmetric with respect to the substrate axis. Especially in case of substrates with other than circular cross-sections or removal with a preferred direction, also any other bending modes, including the simple cylindrical rolls, can be used. Also in general the scope of the invention comprises but is not limited to the embodiments illustrated in the drawings. Numerous modifications can be made to the illustrated and otherwise described or evident embodiments while still remaining within the scope of the invention. In addition, many embodiments described in the text are within the scope of the invention, even if they are not illustrated in the drawings. It should also be noted that while the illustrations are in two dimensions for the sake of clarity, in reality the described processes take place in three dimensions.

REFERENCES

[1] Ward J S, Remo T, Horowitz K, Woodhouse M, Sopori B, VanSant K and Basore P 2016 *Progress in Photovoltaics: Research and Applications* 24 1284-1292 ISSN 10627995 URL http://doi.wiley.com/10.1002/pip.2776

[2] Konagai M, Sugimoto M and Takahashi K 1978 *Journal of Crystal Growth* 45 277-280 ISSN 0022-0248 URL http://www.sciencedirect.com/science/article/pii/0022024878904499

[3] Schubert M F, Thompson J D and Grundmann M 2017 Micro-size devices formed by etch of sacrificial epitaxial layers URL https://patents.google.com/patent/US20170288087/en

[4] Mizuno H, Makita K, Sugaya T, Oshima, R, Hozumi Y, Takato H and Matsubara K 2016 *Japanese Journal of Applied Physics* 55 025001 ISSN 1347-4065 URL https://iopscience.iop.org/article/10.7567/JJAP.55.025001/meta

[5] Kim S, Geum D, Kim S K, Kim H, Song J D and Choi W J 2016 High-speed epitaxial lift-off for III-V-on-insulator transistors on Si substrates 2016 *IEEE SOI-3D-Subthreshold Microelectronics Technology Unified Conference (S3S)* pp 1-2

[6] Yablonovitch E, Gmitter T, Harbison J P and Bhat R 1987 *Applied Physics Letters* 51 2222-2224 ISSN 0003-6951, 1077-3118 URL http://scitation.aip.org/content/aip/journal/apl/51/26/10.1063/1.98946

[7] Schermer J J, Mulder P, Bauhuis G J, Voncken M M a J, Deelen J v, Haverkamp E and Larsen P K 2005 *physica status solidi (a)* 202 501-508 ISSN 1862-6319 URL https://onlinelibrary.wiley.com/doi/abs/10.1002/pssa.200460410

[8] Lee K, Shiu K T, Zimmerman J D, Renshaw C K and Forrest S R 2010 *Applied Physics Letters* 97 101107 ISSN 0003-6951 URL https://aip.scitation.org/doi/10.1063/1.3479906

[9] Brown B, Burrows B, BERKSTRESSOR D, He G and Gmitter T J 2016 Epitaxial lift off systems and methods URL https://patents.google.com/patent/US9381731/en

[10] Cornfeld A, McGlynn D and Varghese T 2014 Epitaxial lift off in inverted metamorphic multijunction solar cells URL https://patents.google.com/patent/US8778199/en

[11] Cheng C W, Li N, Sadana. D K and Shiu K T 2017 Stress Assisted Wet and Dry Epitaxial Lift Off URL https://patents.google.com/patent/US20170069491/en

[12] Forrest S R, Lee K and Zimmerman J 2013 Strain control for acceleration of epitaxial lift-off URL https://patents.google com/patent/WO2013184638A2/en

[13] Breen K R, Wilson R A, McClintock J A and Ahearn J S 1993 *Microscopy Research and Technique* 25 291-296 ISSN 1097-0029 URL https://onlinelibrary.wiley.com/doi/abs/10.1002/jemt.1070250405

[14] Cheng C W, Shiu K T, Li N, Han S J, Shi L and Sadana D K 2013 *Nature Communications* 4 1577 ISSN 2041-1723 URL http://www.nature.com/doifinder/10.1038/ncomms2583

[15] Cheng C W, Li N, Sadana D K, Shi L and Shiu K T 2017 Epitaxial lift-off process with guided etching URL https://patents.google.com/patent/US20170062232/en

[16] Forrest S R, Lee K and Zimmerman J D 2016 Thin film lift-off via combination of epitaxial lift-off and spalling URL https://patents.google.com/patent/US20160197227A1/ko

[17] Kim Y, Kim K, Jung S H, Kim C Z, Shin H B, Choi J and Kang H K 2017 *Applied Physics Letters* 111 233509 ISSN 0003-6951 URL https://aip.scitation.org/doi/full/10.1063/1.5001357

[18] Yoon J, Jo S, Chun I S, Jung I, Kim H S, Meitl M, Menard E, Li X, Coleman J J, Paik U and Rogers J A 2010 *Nature* 465 329-333 ISSN 1476-4687 URL https://www.nature.com/articles/nature09054

[19] Cheng C W, Li N and Shiu K T 2013 High throughput epitaxial liftoff for releasing multiple semiconductor device layers front a single base substrate URL https://patents.google.com/patent/US20130082303A1/en?oq=D10: +US+2013082303+A1+(CHENG+CHENG-WEI+[US]+et+al.)+04+April+2013+ (04.04.2013)

[20] He G and Hegedus A 2015 Multiple stack deposition for epitaxial lift off URL https://patents.google.com/patent/US9068278/en

[21] Rogers J A, Nuzzo R G, Meitl M, Ko H C, Yoon J, Menard E and Baca A J 2019 Method of printing transferable functional structures URL https://patents.google.com/patent/EP2064734B1/en?inventor=Jongseung+Yoon&oq=Jongseung+Yoon

[22] Cavallo F and Lagally M G 2010 *Soft Matter* 6 439-455 ISSN 1744-6848 URL https://pubs.rsc.org/en/content/articlelanding/2010/sm/b916582g

The invention claimed is:

1. A structure comprising a growth substrate and a plurality of vertically stacked base layer groups, each base layer group comprising a sacrificial layer and an epitaxial film and the film comprising any number of device or component layers and strained layers positioned anywhere in the film, characterized in that the plurality of the vertically stacked base layers groups is formed of epitaxially grown semiconductor layers and includes layers with built-in strain in more than one epitaxial films, that in combination with the parameters of the sacrificial layers and the films themselves, are configured
   i) to individually bend the films, located anywhere in the layer stack, upon the removal of the sacrificial layers, and
   ii) to individually control the release rate of the films and the rate of removal of the corresponding sacrificial layers, and
   iii) to release more than one large area film from the vertical stack in a single lift-off process, where the films are released without substantial fracturing and at least one of the releasing films has a radius of curvature that is different from the other films, and where external handles, supports or separately attached strain layers do not cover the top or bottom surface of each released film when they are released.

2. A structure according to claim 1, wherein the built-in strain in different films in combination with the material composition of different sacrificial layers is configured to enable the release of two or more of the epitaxial films at remarkably different rates in a single process, preferably fastest removal rates configured for the layers released furthest from the substrate, and the different bending is configured to facilitate the separation and prevent adhesion of the released films during and after their removal.

3. A structure according to claim 1, characterized in that one or more strained layers in one or more epitaxial films are configured to be removed selectively during the lift-off, and the bending or the curvature of the said epitaxial film is configured to change as the said strained layers are removed.

4. A structure according to claim 1, characterized in that one or more of the sacrificial layers are configured to be selectively removed by electrochemical and/or wet chemical etching or other removal methods.

5. A structure as defined in claim 1, wherein one or more of the layer parameters such as the strain in the strained layers or in the device or component layers or composition in any of the strained layers or in any of the sacrificial layers or device or component layers are anisotropic either due to inherent properties configured in the epitaxial process or due to external stimuli (such as applied voltage), and the anisotropy is configured to determine the direction of the lift-off.

6. A structure as defined in claim 1, wherein the first growth layer is a multilayer structure, where some of the sublayers are configured to act as the sacrificial layers and others are configured to facilitate the substrate re-use and/or to initiate the growth.

7. A structure as defined in claim 1, wherein one or more of the sacrificial layers comprise more than one sublayer that include more than one material or composition, configured to enable controllable reactivity of the said layers to etching or other removal methods, and/or to suppress strain-induced defect propagation in the structure.

8. A structure as defined in claim 1, wherein the device or component layers comprise layers designed for, or used for, the fabrication of thin-film solar cells, LEDs, lasers and/or any other devices and/or layers needed in the fabrication of components e.g. for use in optics, photonics, electronics and/or optoelectronics such as polarizers, waveguides, photonic crystals and microring resonators, that can be fabricated and/or patterned prior to or after or during the lift-off.

9. A method for epitaxial lift-off of large-area epitaxial films from their substrate, the method using a plurality of vertically stacked base layer groups, each base layer group comprising a sacrificial layer and an epitaxial film and the film comprising any number of device or component layers and strained layers positioned at any location of the film characterized by the release of more than one stacked large-area film in the plurality of the vertically stacked base layers groups made of epitaxially grown semiconductors without substantial fracturing in a single process that selectively removes more than one sacrificial layer(s) and bends more than one released film(s) anywhere within the stack due to the built-in internal strain of the films, with at least one of the films having a radius of curvature that is different from other films, and the said lift-off method controlling the release of each film individually by accelerating the sacrificial layer removal and the said lift-off method facilitating the film separation without using external handles, supports or separately attached strain layers covering the top or bottom surface of each released film during the release.

10. A method as defined in claim 9, wherein the point of time of the release of multiple films is individually controlled by tuning the internal strain of the epitaxial films in combination with the material composition of the sacrificial layers and other properties the films and where the release rate of at least one of the epitaxial films is designed to differ from the release rate of the other films, preferably the fastest release rates used for the layers closest to the top of the stack.

11. A method as defined in claim 9, where any of the parameters such as the composition, materials and multi-layer structure of the sacrificial layer(s) or the released film are designed to control the number of the released epitaxial films by modifying the selectivity of the layers towards chemicals, electrochemical etching or other removing means.

12. A method as defined in claim 9, where the epitaxial lift-off process is carried out in an etching liquid and one or more of the strained layers is removed partly or completely to alter or remove the strain or bending of the epitaxial film(s) after a period of time during or after the lift-off before extracting the said film(s) from the liquid.

13. A method as defined in claim 9, where the growth on the substrate is initiated with a multilayer, where some of the sublayers are used as sacrificial layers to facilitate lift-off and some others to facilitate substrate reuse e.g. by their partial or complete removal during or after the lift-off.

14. A method as defined in claim 9, where the removal of any of the sacrificial layers has a preferred direction enabled by (i) anisotropy of the etching speed due to anisotropic strain of the strained layers and/or anisotropic etching rate of the sacrificial layer(s), either of which is generated with or without external stimulus (e.g. piezo) and/or (ii) directional or partial exposure to the etchants (cf droplet initiated etching or etching by dipping or by protecting some areas from exposure to etchants) and/or (iii) by otherwise activating a lift-off mode where the released layers are released in the forms of cylindrical surfaces.

15. A method as defined in claim 9, where the released epitaxial films are collected and transferred or attached to suitable carriers, by means of (i) draining the etchants, and/or (ii) replacing the etchant with other liquids, and/or (iii) guiding the layers onto said carriers, where the carrier's surface properties with respect to the liquid and the film are adapted to remove or expel the liquid from between the released film and the carrier, and to control the adhesion between the film and the carrier, and/or to create a functional interface such as an electrical contact between the carrier and the epitaxial film.

* * * * *